(12) United States Patent
Chou et al.

(10) Patent No.: US 8,932,801 B2
(45) Date of Patent: Jan. 13, 2015

(54) PHOTOSENSITIVE POLYIMIDES

(75) Inventors: Meng-Yen Chou, Kaohsiung (TW); Chuan Zong Lee, Kaohsiung (TW)

(73) Assignee: Eternal Chemical Co., Ltd., Taiwan (CN)

( * ) Notice: Subject to any disclaimer, the term of this patent is extended or adjusted under 35 U.S.C. 154(b) by 0 days.

(21) Appl. No.: 12/354,905

(22) Filed: Jan. 16, 2009

(65) Prior Publication Data

US 2009/0181324 A1 Jul. 16, 2009

(30) Foreign Application Priority Data

Jan. 16, 2008 (TW) .............................. 97101740 A

(51) Int. Cl.
| | | |
|---|---|---|
| *G03F 7/038* | (2006.01) | |
| *C08F 283/04* | (2006.01) | |
| *C08G 18/60* | (2006.01) | |
| *C08G 73/12* | (2006.01) | |
| *C08G 73/10* | (2006.01) | |
| *C08L 79/08* | (2006.01) | |
| *H05K 3/28* | (2006.01) | |

(52) U.S. Cl.
CPC .......... *C08G 73/126* (2013.01); *C08G 73/1042* (2013.01); *C08G 73/12* (2013.01); *C08G 73/123* (2013.01); *C08G 73/124* (2013.01); *C08G 73/127* (2013.01); *C08L 79/085* (2013.01); *G03F 7/0387* (2013.01); *H05K 3/287* (2013.01); *Y10S 430/107* (2013.01)
USPC ...................... 430/287.1; 430/270.1; 430/906

(58) Field of Classification Search
CPC .... G03F 7/0387; C08F 283/04; C08G 18/603
USPC ............ 430/270.1, 287.1, 907, 906; 528/353; 525/424, 426
See application file for complete search history.

(56) References Cited

U.S. PATENT DOCUMENTS

| | | | | |
|---|---|---|---|---|
| 5,616,448 A | * | 4/1997 | Kato ........................... | 430/283.1 |
| 5,914,354 A | * | 6/1999 | Kato .............................. | 522/99 |
| 6,511,789 B2 | * | 1/2003 | Naiini et al. ................ | 430/283.1 |
| 6,849,385 B2 | * | 2/2005 | Nagoya et al. ............. | 430/283.1 |
| 7,638,259 B2 | * | 12/2009 | Goto et al. ................. | 430/270.1 |
| 2004/0265731 A1 | | 12/2004 | Okada et al. | |
| 2008/0146692 A1 | * | 6/2008 | Uehara et al. ................ | 522/134 |

FOREIGN PATENT DOCUMENTS

| | | |
|---|---|---|
| EP | 1568723 | 8/2005 |
| EP | 1 826 230 | 12/2005 |
| JP | S58-029821 | 2/1983 |
| JP | 5-232701 A | 9/1993 |
| JP | H10-265571 A | 10/1998 |
| JP | H11-92660 A | 4/1999 |
| JP | 2000-147761 A | 5/2000 |
| JP | 2002-00 6490 A | 1/2002 |
| TW | 2004-17294 | 1/2003 |
| TW | 2003-00519 A | 6/2003 |
| WO | 2006/064867 | 6/2006 |

OTHER PUBLICATIONS

Office Action in Chinese Patent Application 200810007025.9 Issued on May 12, 2011 With Translation.
Notice of Reasons for Rejections in Application 2009-007012 on May 30, 2011 With Translation.
Computer Generated Translation of Japanese Application 2000-147761 A Published May 26, 2000.
Patent English Abstract of Japanese Application H10-265571 Published Oct. 6, 1998.
Computer Generated Translation of Japanese Application H11-92660 A Published Apr. 6, 1999.
Patent English Abstract of Japanese Application S58-029821 A Published Feb. 22, 1983.
Patent English Abstract of Japanese 2002-006490 A Published Jan. 9, 2002.
Grand Encyclopedia of Science Reduced-Size $7^{th}$ Edition, Japan, Kyouritsu Shuppan Inc., Sep. 15, 1972, Reduced-Size Edition $14^{th}$ Publishing, p. 475, Refer to "Vinyl Article".
Search Report (Taiwan) Patent Application No. 097101740 (Translation).
Office Action issued by the State Intellectual Property Office of the P.R.C (SIPO) on Oct. 15, 2012 for corresponding Chinese Patent Appln. No. 200810007025.9.

* cited by examiner

*Primary Examiner* — John Chu
(74) *Attorney, Agent, or Firm* — Ladas & Parry LLP

(57) ABSTRACT

The present invention relates to an isocyanate-modified photosensitive polyimide. The photosensitive polyimide of the invention possesses excellent heat resistance, chemistry resistance, and flexibility, and can be used as a liquid photo resist or dry film resist, or used in a solder resist, coverlay film, or printed wiring board.

18 Claims, No Drawings

PHOTOSENSITIVE POLYIMIDES

BACKGROUND OF THE INVENTION

1. Field of the Invention

The present invention relates to an isocyanate-modified photosensitive polyimide. The photosensitive polyimide of the invention possesses excellent heat resistance, chemistry resistance, and flexibility, and can be used as a liquid photo resist or dry film resist, or used in a solder resist, coverlay film, or printed wiring board.

2. Description of the Prior Art

These days, electronic products are made light and small. Therefore, various electronic parts have been miniaturized. Since flexible printed wiring boards are excellent in flexibility and weight, the demand for them has been increased.

With respect to the materials for coverlay film, they can be classified into three types: photosensitive coverlay, non-photosensitive coverlay, and thermal plastic coverlay. Photosensitive coverlay can be polyimide based (PI based coverlays) or non-polyimide based (non-PI based coverlays), while utilization of the non-polyimide based coverlay is limited because it has lower heat resistance and a higher coefficient of thermal expansion. As to non-photosensitive coverlay, its manufacture is more complicated than that of photosensitive coverlay, and it is not as useful as photosensitive coverlay. As to thermal plastic coverlay, it needs post processing for forming holes and is not as convenient to use as photosensitive coverlay.

U.S. Pat. No. 6,605,353 discloses an epoxy-modified polyimide. However, since these polymers are produced by reacting an epoxy and acid, the reactivity is not good and after ring opening, the OH functional groups will react again with the epoxy radicals. Given the above, the epoxy-modified polyimide would have problems associated with stability and heat resistance.

To improve the heat resistance and processing convenience of coverlays, there have been demands in the art for photosensitive polyimides which are free of the above-mentioned drawbacks.

SUMMARY OF THE INVENTION

The present invention provides an isocyanate-modified photosensitive polyimide. The photosensitive polyimide of the invention has a good reactivity and possesses excellent stability and heat resistance, and can be cured at a low temperature. The photosensitive polyimide of the invention can be used as a liquid photo resist or dry film resist, and can be used in the formation of thick films.

The present invention further provide a photosensitive composition comprising the above-mentioned photosensitive polyimide for use as a protective material The photosensitive composition of the invention possesses excellent electrical properties, heat resistance, flexibility, and chemistry resistance, and can be used as a material for used in a solder resist, coverlay, and printed wiring board.

DETAILED DESCRIPTION OF THE INVENTION

The photosensitive polyimide according to the present invention has the structure of the following formula (I):

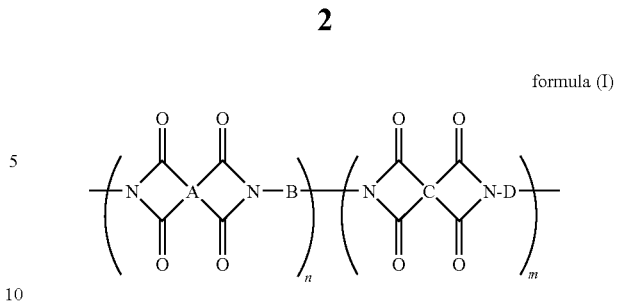

formula (I)

wherein:

A and C can be the same or different and each represent a tetravalent organic group;

B represents a divalent organic group containing at least one of the following radicals:

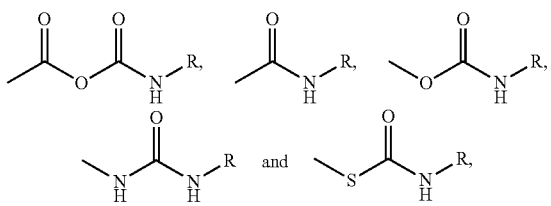

wherein R represents a vinyl-group containing unsaturated radical or a radical of the following:

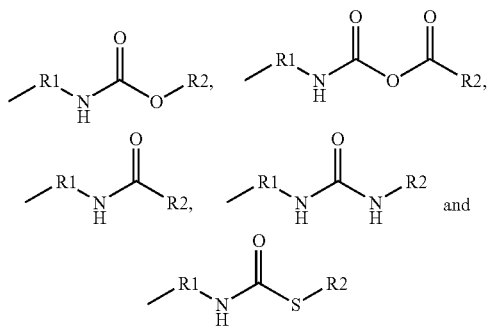

wherein:

R1 represents a substituted or unsubstituted C1-C20 saturated or unsaturated organic radical, and R2 represents a vinyl-group containing unsaturated radical;

D represents a divalent organic group;

n is an integer of more than 0; and m is an integer of 0 or more.

Preferably, the above-mentioned vinyl-group containing unsaturated radical is selected from the group consisting of:

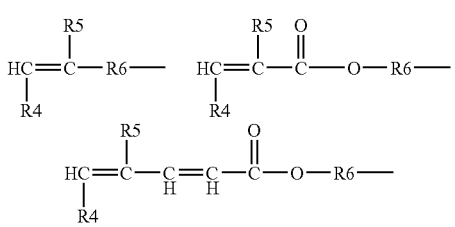

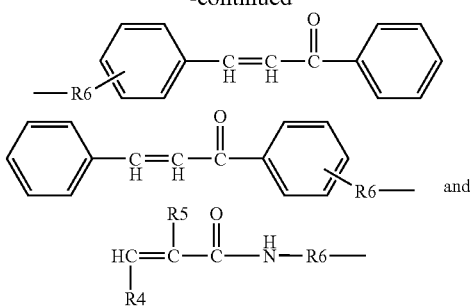

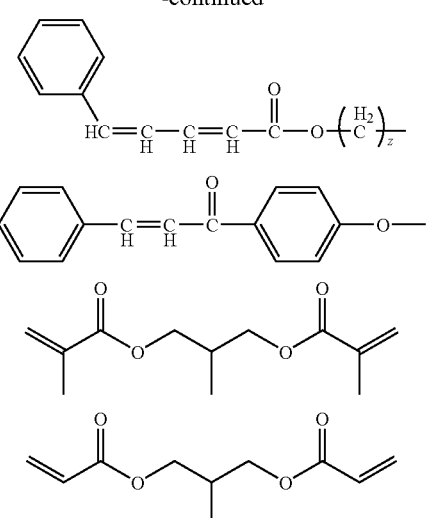

wherein R4 and R5 each represent H or a substituted or unsubstituted C1-C5 alkyl group, and R6 represents a covalent bond or a substituted or unsubstituted C1-C20 organic radical.

More preferably, the above-mentioned vinyl-group containing unsaturated radical is selected from the group consisting of:

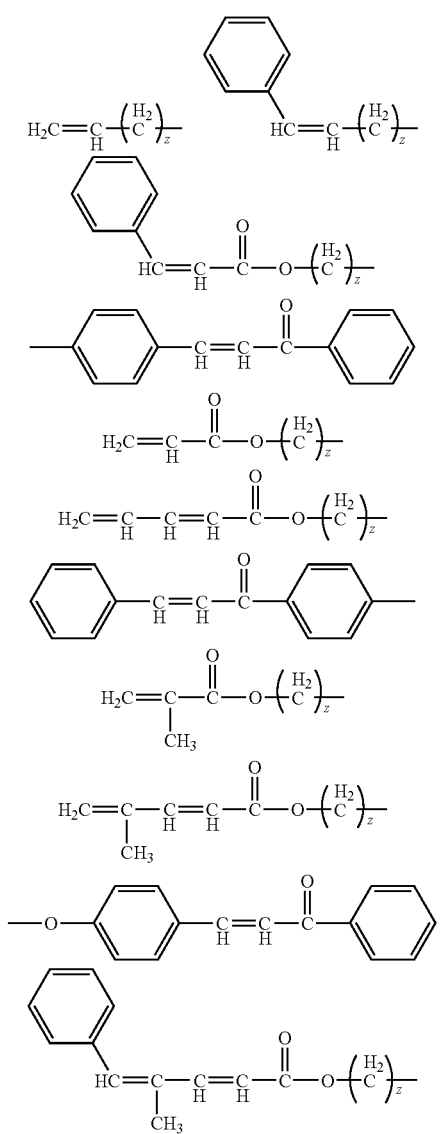

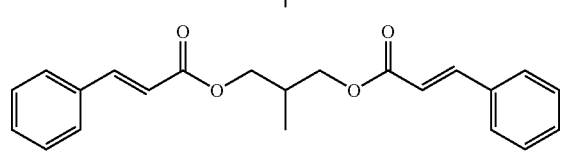

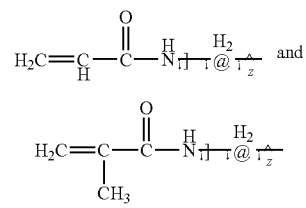

wherein z represents an integer from 0 to 6.

Most preferably, the above-mentioned vinyl-group containing unsaturated radical is selected from the group consisting of:

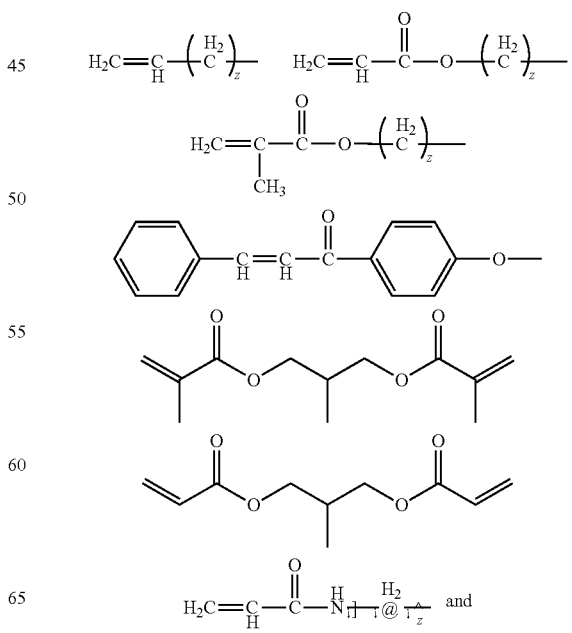

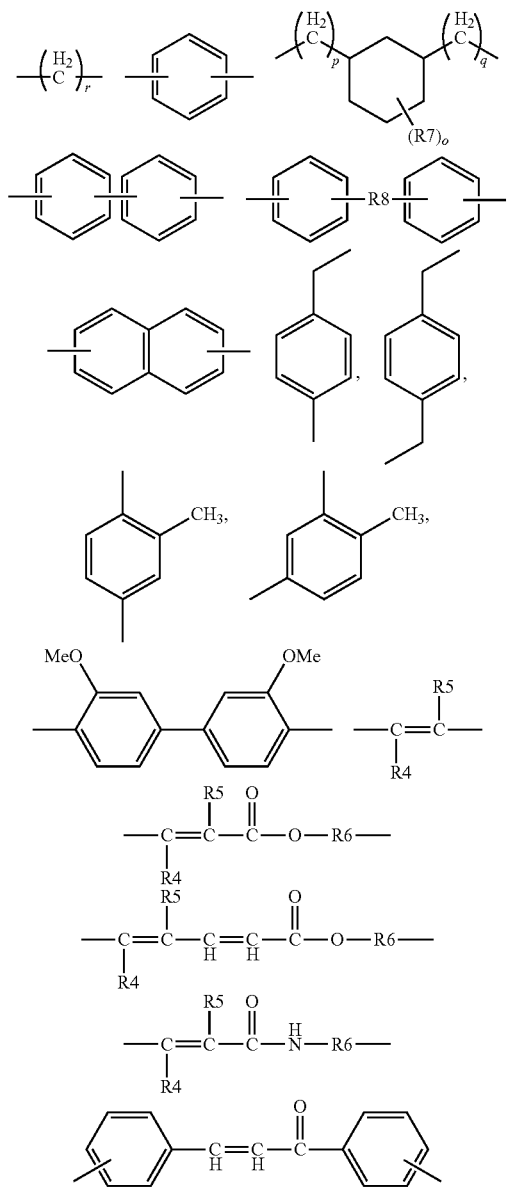

wherein z represents an integer from 0 to 6.

According to an embodiment of the present invention, in the above formula (I), R1 represents a radical selected from the group consisting of:

wherein:
o, p, q, and r each represent an integer of 0 or more;
R4, R5, and R6 are as defined hereinbefore;
R7 represents H or a substituted or unsubstituted C1-C12 organic radical; and
R8 represents a covalent bond or an organic radical selected from the group consisting of:

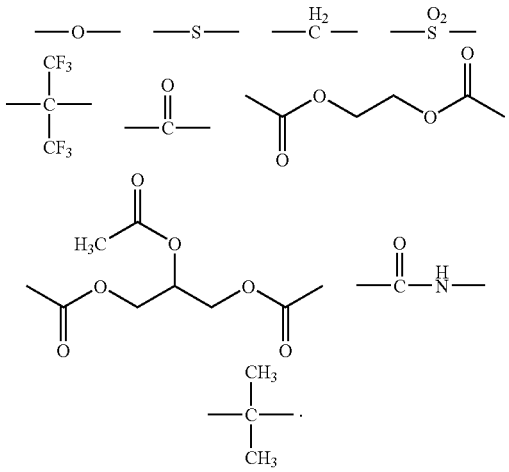

More preferably, R1 is selected from the group consisting of:

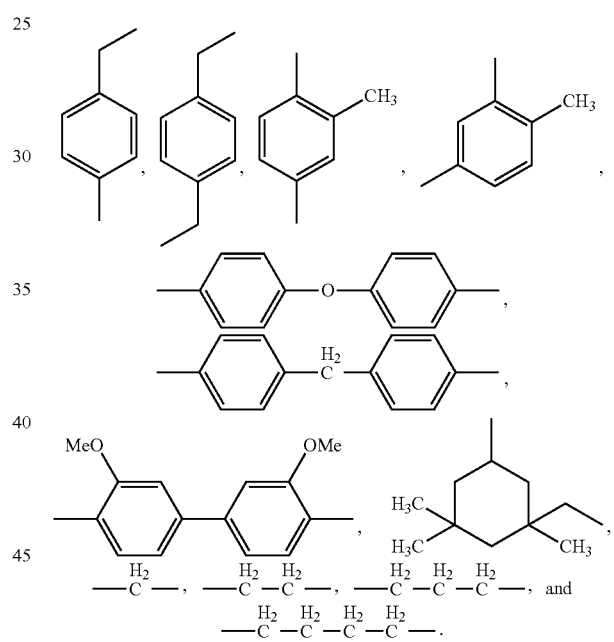

The tetravalent organic groups A and C of the photosensitive polyimide of formula (I) of the present invention are not particularly limited. For example, they can be tetravalent aromatic groups or tetravalent aliphatic groups. Preferably, A and C are independently selected from the group consisting of:

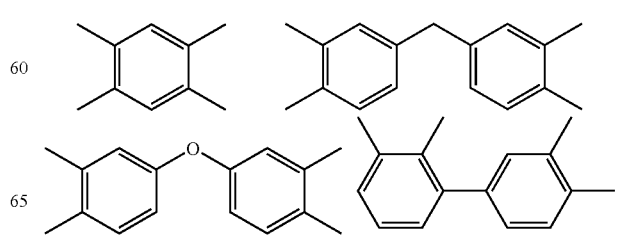

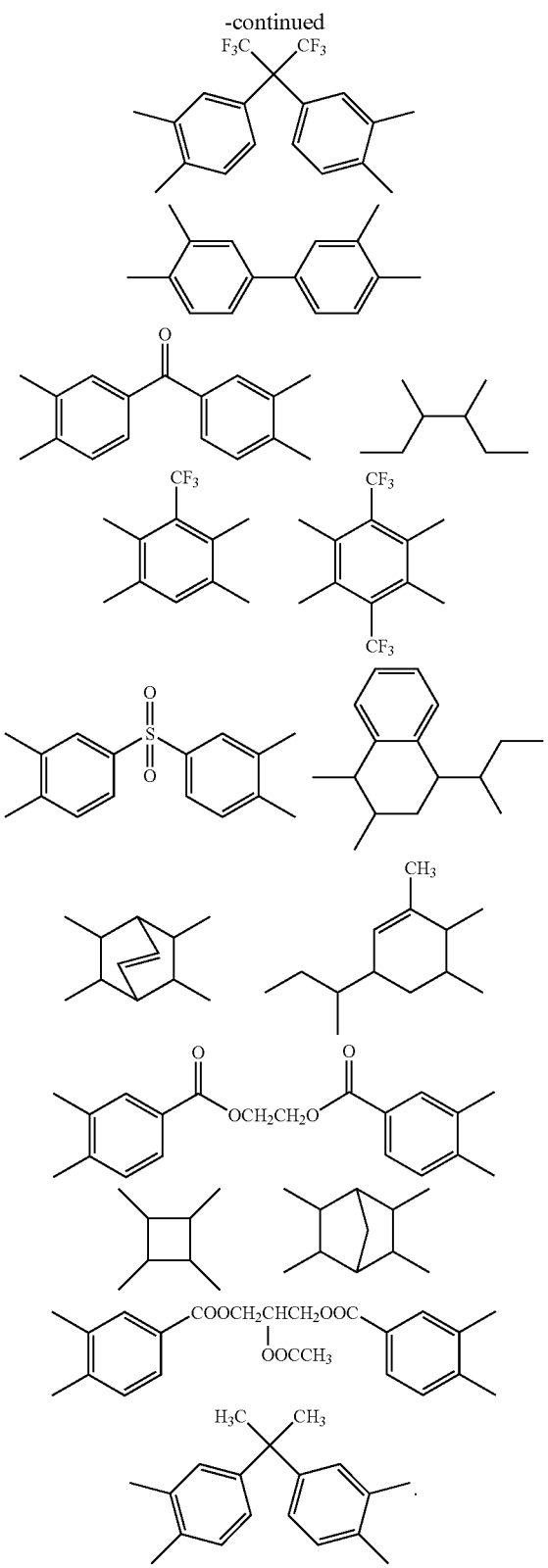

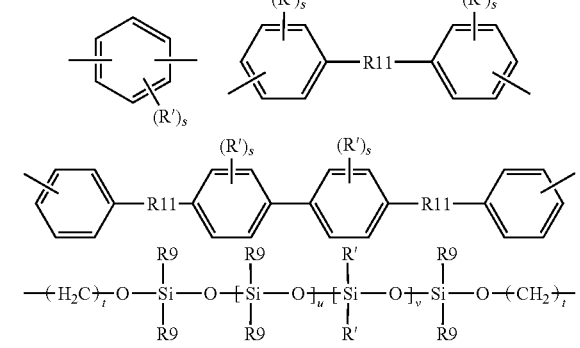

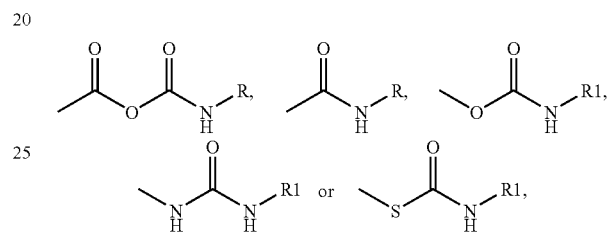

wherein:
R' is an organic group containing

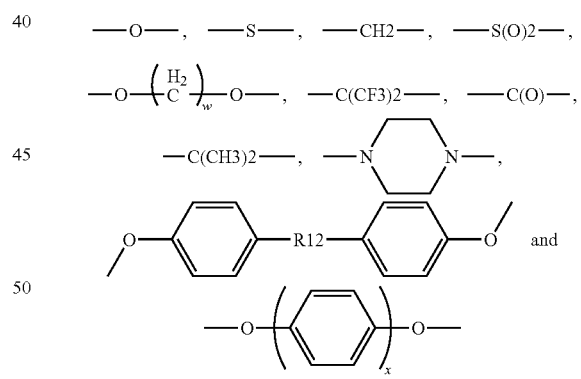

where R is defined as hereinbefore;
R9 represents H, methyl, or ethyl;
s is an integer of 1 to 4;
t is an integer of 0 to 5;
u is an integer of 0 or more;
v is an integer of more than 0; and
R11 represents a covalent bond or a radical selected from the group consisting of:

$$-O-, \quad -S-, \quad -CH2-, \quad -S(O)2-,$$

$$-O-\left(C\overset{H_2}{}\right)_w-O-, \quad -C(CF3)2-, \quad -C(O)-,$$

$$-C(CH3)2-, \quad -N\underset{\phantom{x}}{\diagdown}N-,$$

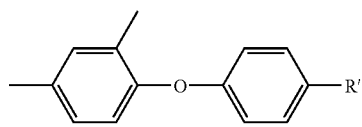 and $$-O-\left(\phantom{x}\right)_x-O-$$

wherein w and x each represent an integer of more than 0, and R12 represents a covalent bond or a substituted or unsubstituted C1-C18 organic radical.

Preferably, the group B in formula (I) is selected from the group consisting of:

The group B of the inventive photosensitive polyimide of formula (I) is derived from a diamine having a reactive functional group, such as OH, COOH, NH₂, or SH. Preferably, the reactive functional group is OH or NH₂. Preferably, the group B is selected from the group consisting of:

wherein R' is as defined hereinbefore.

Most preferably, the group B of formula (I) is selected from the group consisting of:

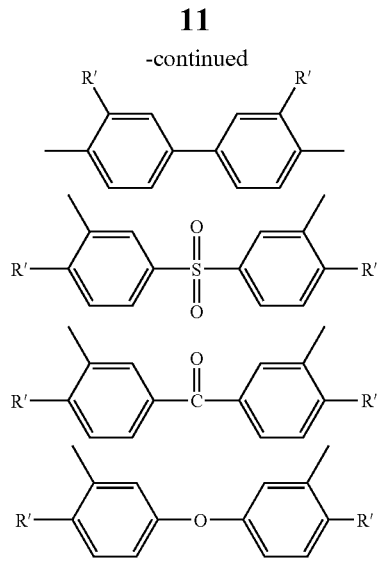

wherein R' is as defined hereinbefore.

The group D of the inventive photosensitive polyimide of formula (I) is derived from a diamine with or without a reactive functional group. Preferably, the group D is selected from the group consisting of:

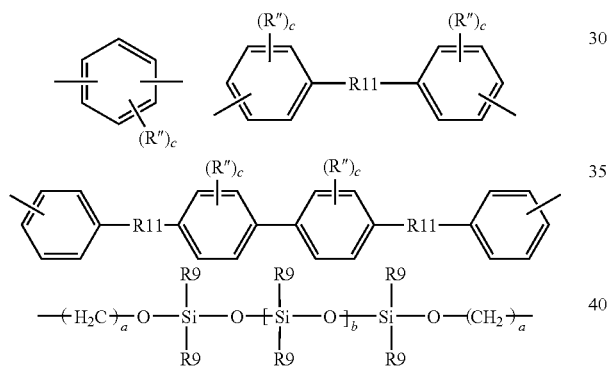

wherein:
R" represents H, C—C4 alkyl, C1-C4 perfluoroalkyl, methoxy, ethoxy, a halogen, OH, COOH, NH$_2$, or SH;
R9 and R11 are as defined hereinbefore;
c is an integer of 0 to 4;
a is an integer of more than 0, and
b is an integer of more than 0.

Preferably, the group D in formula (I) is selected from the group consisting of:

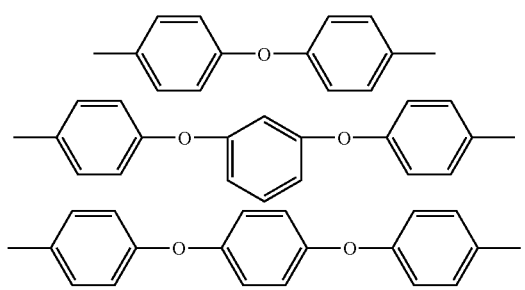

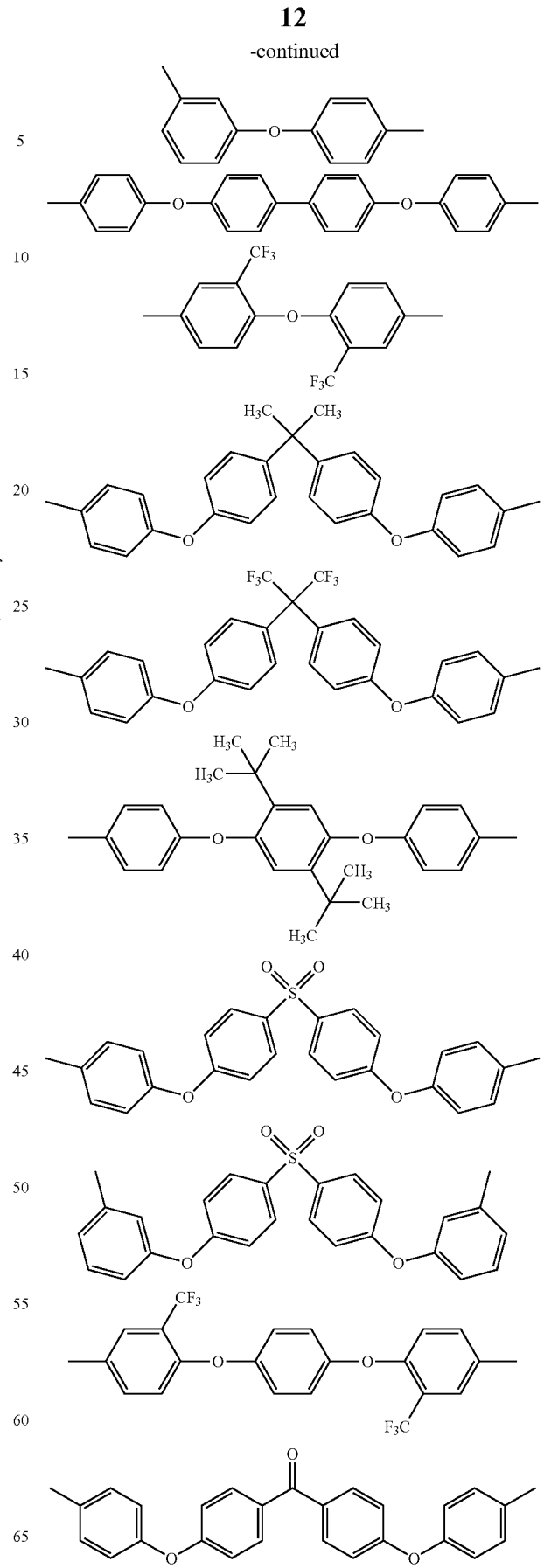

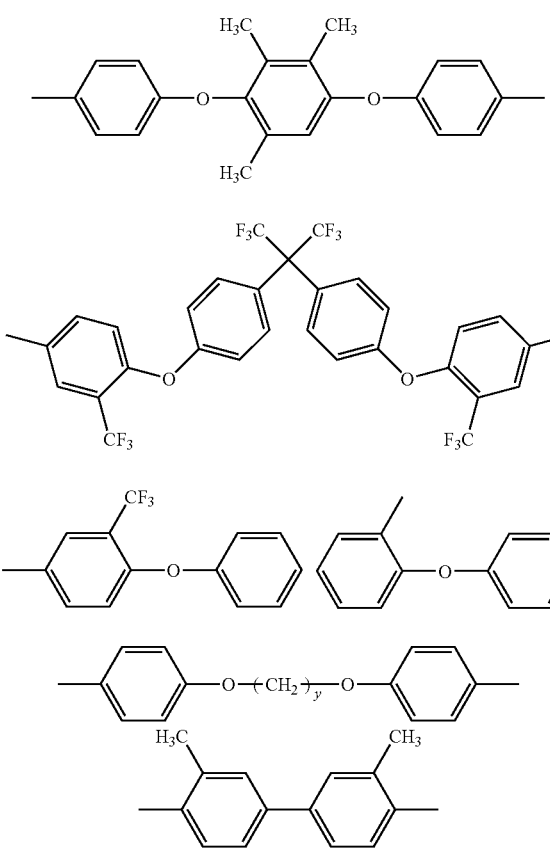

wherein y is an integer of 1 to 12, preferably, 1 to 6.

The photosensitive polyimide of the present invention can be produced by any conventional polymerization process known to persons having ordinary skill in the art, such as a process comprising the following steps:

(a) reacting a dianhydride of the following formula (1) with a diamine (I) of formula

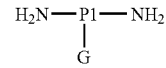

and a diamine (II) of formula $H_2N$—P2-$NH_2$ to form a compound of the following formula (2):

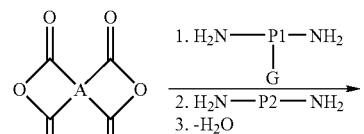

wherein G is a reactive functional group, and in the case where G is OH, conducting the following step:

b) adding an isocyanate compound of formula O=C=N—R to the product obtained from step (a) to form a compound of formula (3):

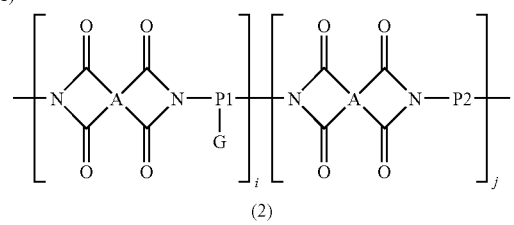

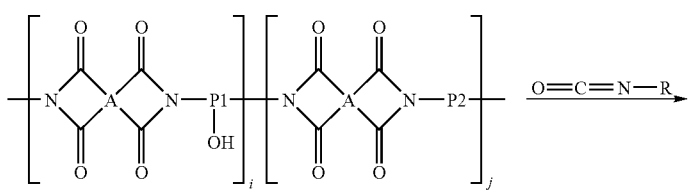

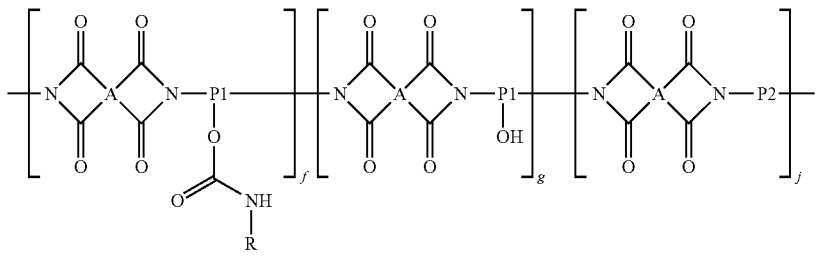

wherein f+g=i

In the above process for preparing the photosensitive polyimide, the dianhydride used can be aliphatic or aromatic, and is preferably, but not limited to, the compound selected from the following:

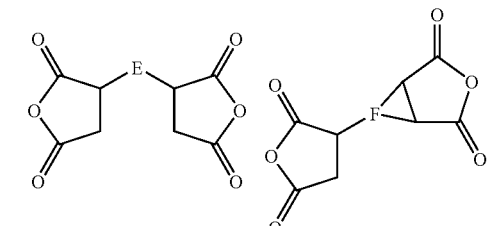

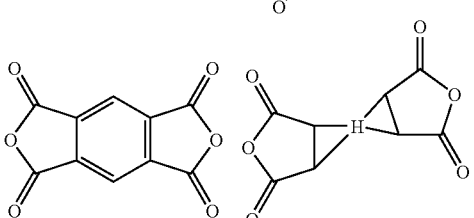 and wherein E, F, and H independently represent a covalent bond or a substituted or unsubstituted C1-C20 saturated or unsaturated, cyclic or non-cyclic organic radical;
R3 is a covalent bond or a radical selected from the following:

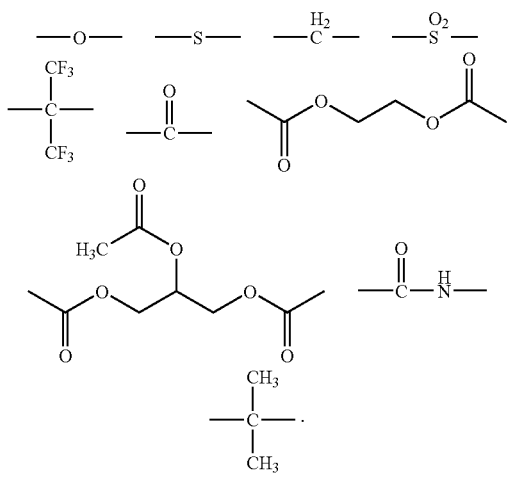

More preferably, the dianhydride used in the present invention is selected from the following compounds:

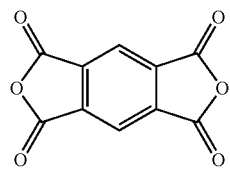

-continued

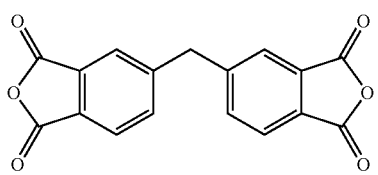

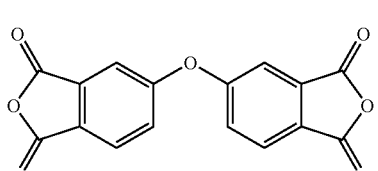

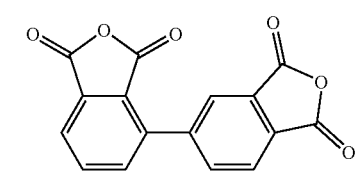

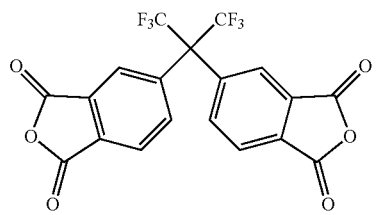

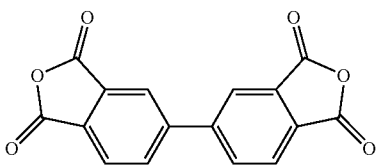

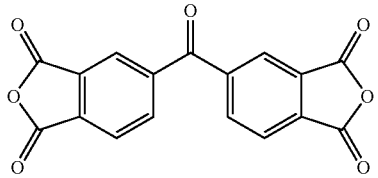

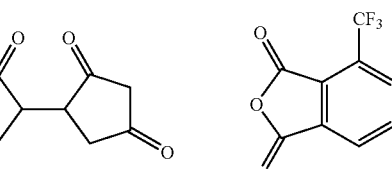

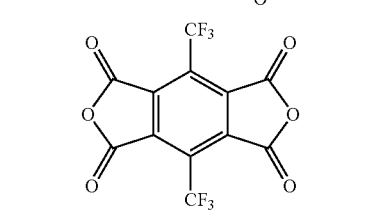

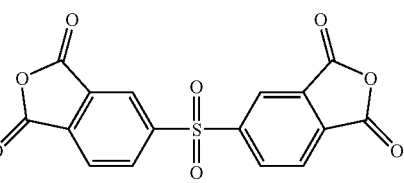

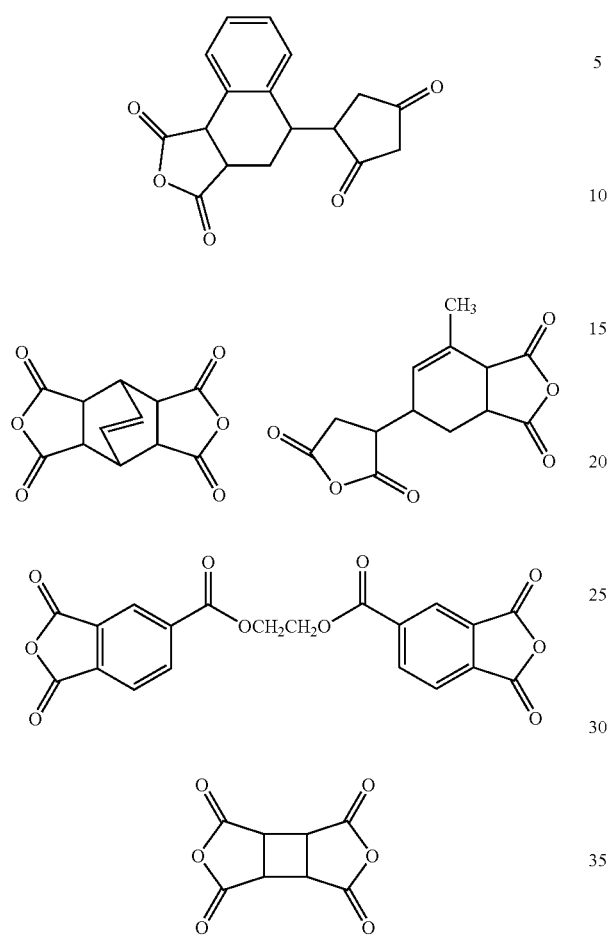
or a mixture thereof.
In the above process for preparing the photosensitive polyimide, the diamine (I) of formula
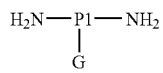
used should contain the functional group G (such as OH, COOH, $NH_2$, or SH). The diamine (II) of formula
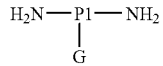
useful in the present invention includes, but is not limited to, the following:
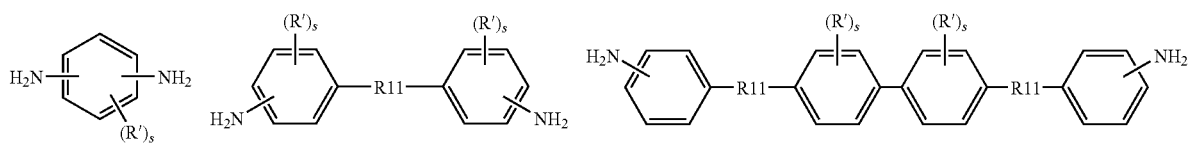
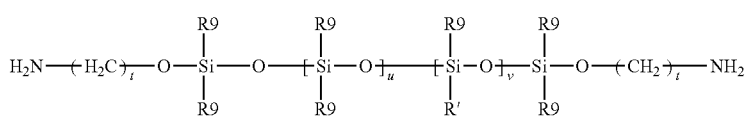

wherein R' represents an organic group containing a radical of

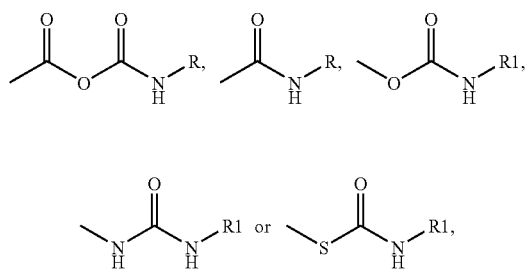

where R is as defined hereinbefore;
R9 represents H, methyl, or ethyl;
s is an integer of 1 to 4;
t is an integer of 0 to 5;
u is an integer of 0 or more;
v is an integer of more than 0;

R11 represents a covalent bond or a radical selected from the group consisting of:

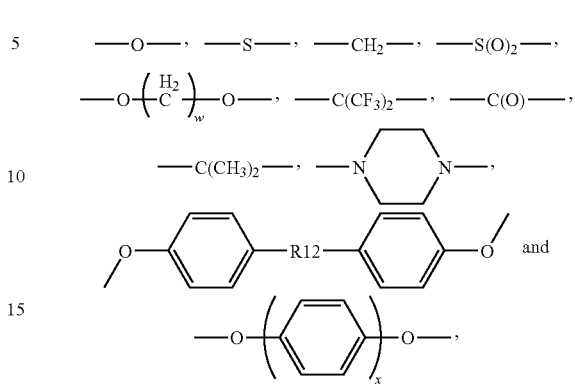

wherein:
w and x each represent an integer of more than 0, and
R12 represents a covalent bond or a substituted or unsubstituted C1-C18 organic group.

Preferably, the above-mentioned diamine (I) is selected from the group consisting of:

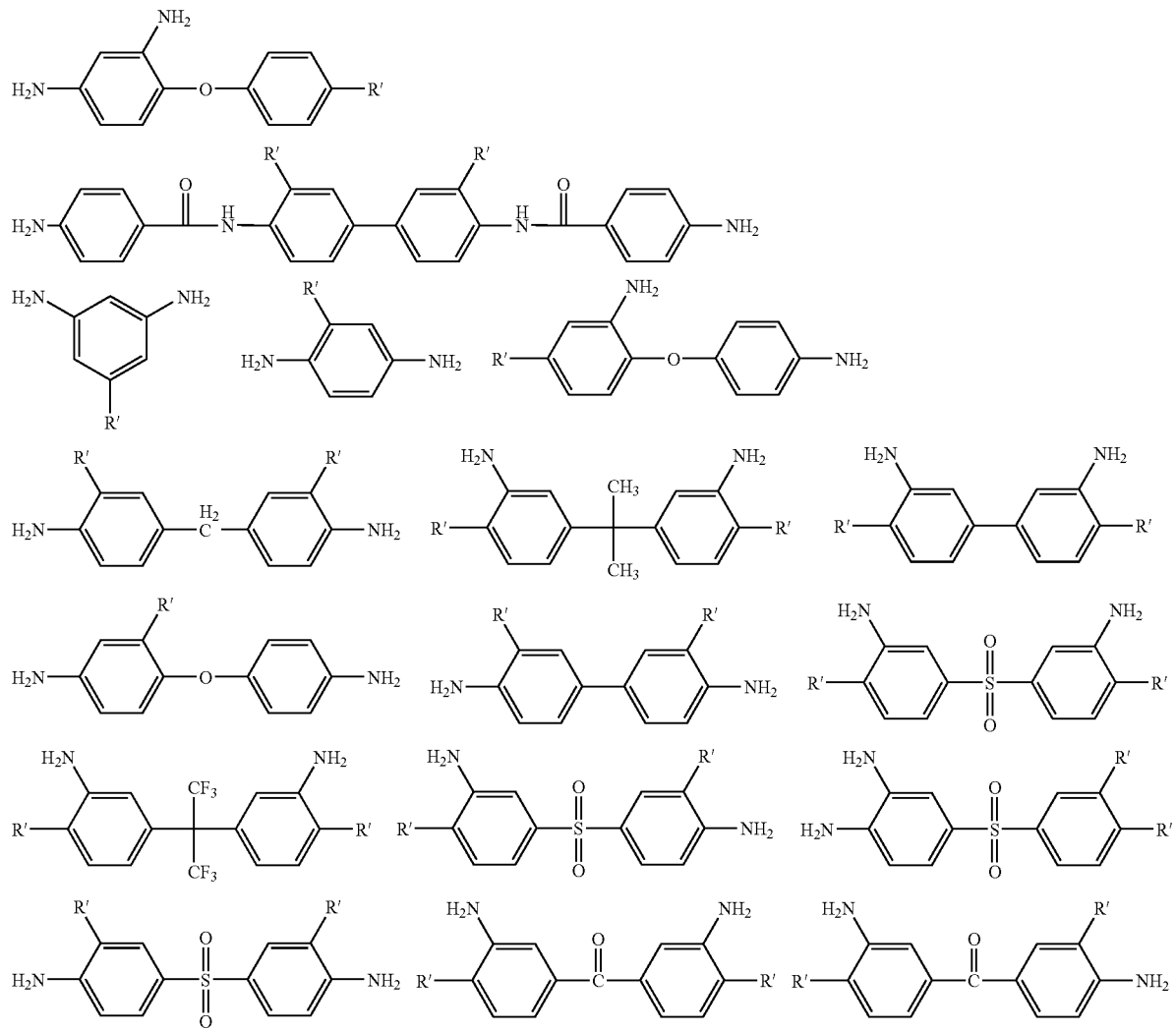

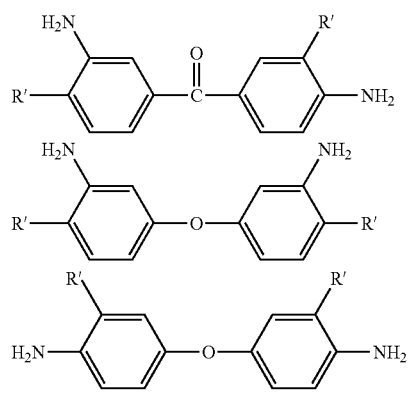
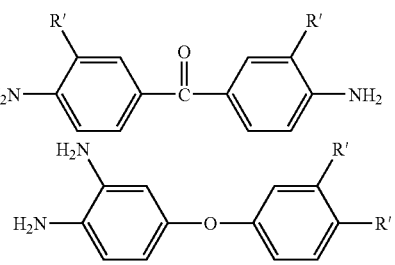

wherein R1 is as defined hereinbefore.

More preferably, the above-mentioned diamine (I) is selected from the group consisting of:

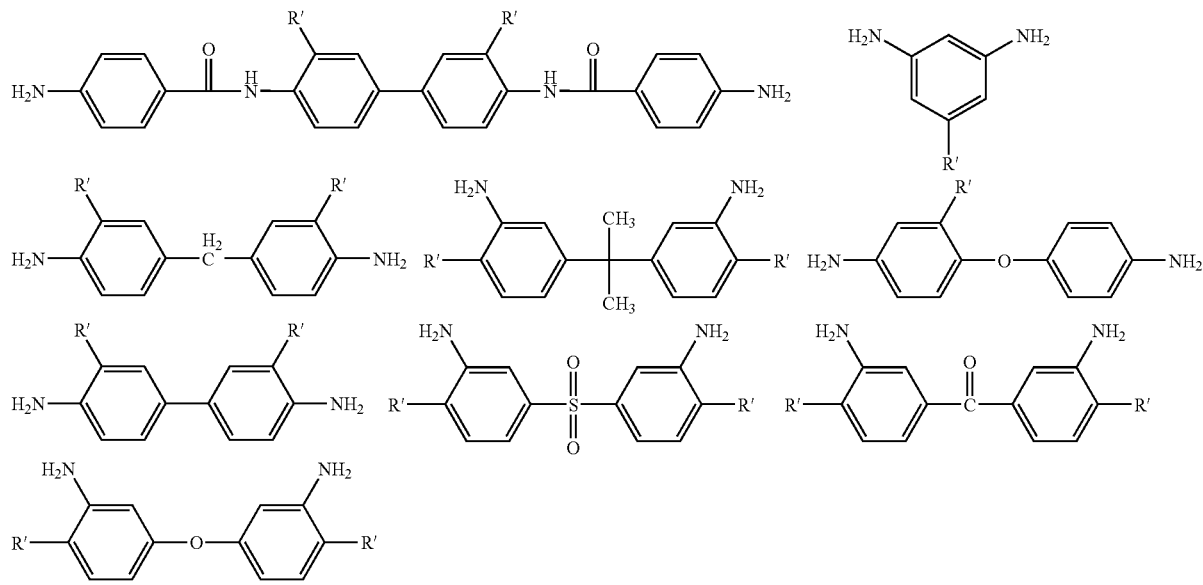

wherein R' is as defined hereinbefore.

In the above process for preparing the photosensitive polyimide, the diamine (II) of formula: $H_2N-P2-NH_2$ used is not particularly limited and may or may not contain a functional group. The diamine (II) of formula: $H_2N-P2-NH_2$ without a function group useful in the present invention includes, but is not limited to, the following:

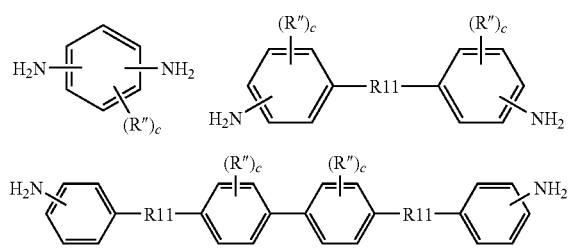

-continued

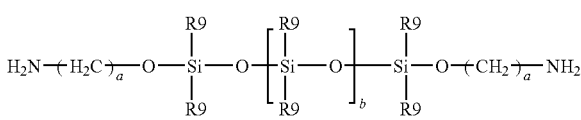

wherein:

R" represents H, C1-C4 alkyl, C1-C4 perfluoroalkyl, methoxy, ethoxy, or a halogen;

R9 and R11 are as defined hereinbefore;

c is an integer of 0 to 4;

a is an integer of more than 0; and b is an integer of more than 0.

Preferably the above-mentioned diamine (II) is selected from the group consisting of:
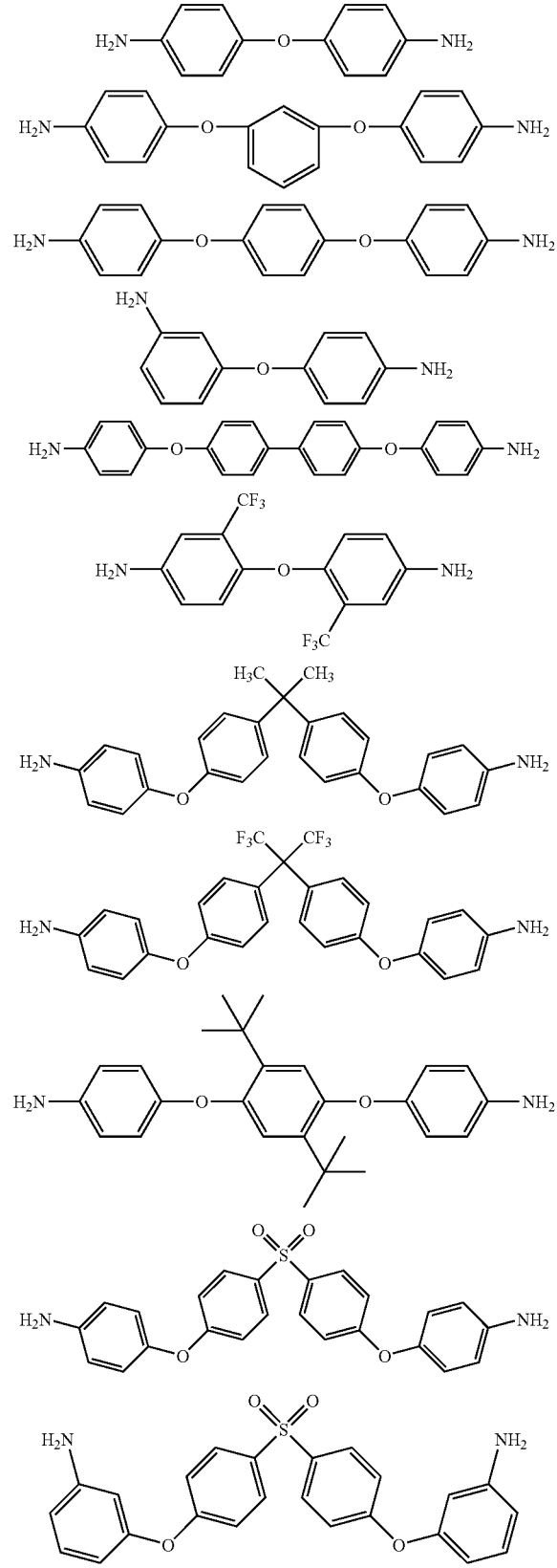
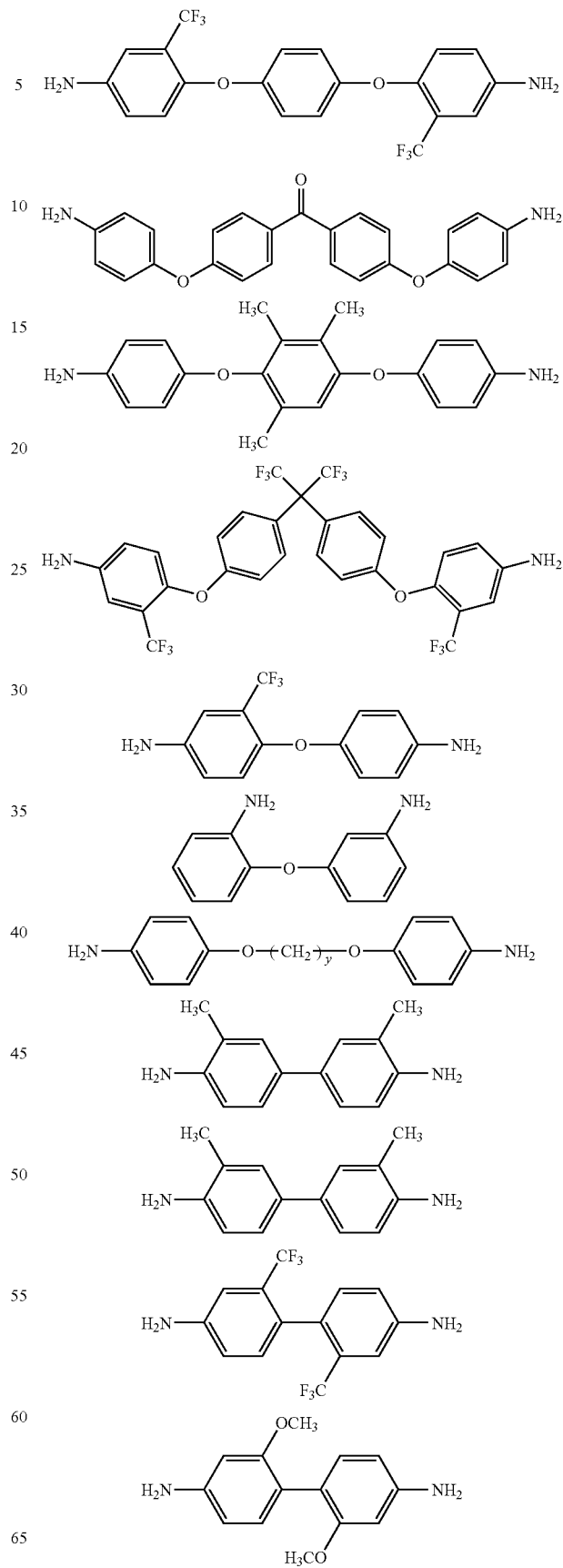

-continued

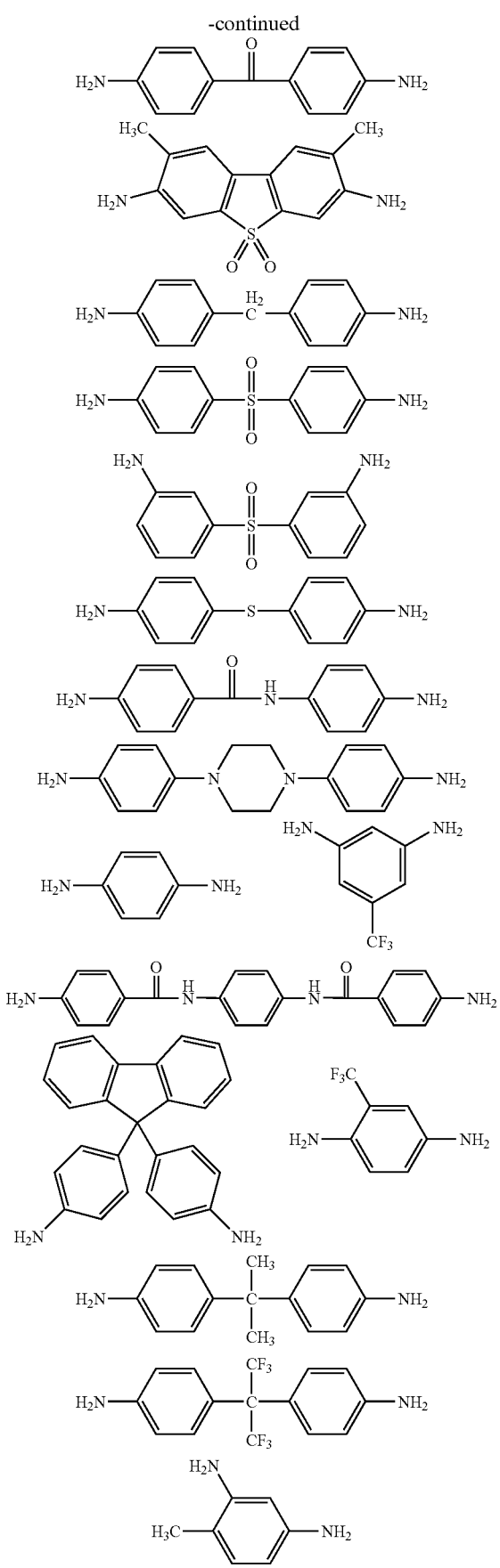

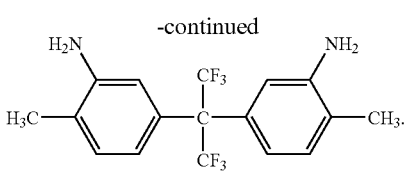

In order to impart polyimides with a photosensitive group so that radiation curing mechanism can be utilized, the present invention modifies polyimides with an isocyanate having a photosensitive group, such as a C=C double bond. The isocyanates can be monoisocyanates or diisocyanates, of which monoisocyanates are preferred. The isocyanate used in the present invention will react with the reactive group, such as —OH, —COOH, —SH, or —NH$_2$, in the polyimides and thus makes the polyimides modified. The isocyanate used in the present invention can be represented by O=C=N—R, wherein R is R* or represents a radical of the following:

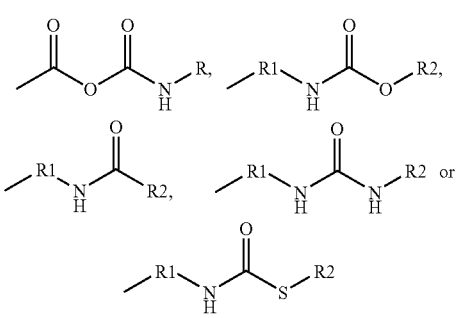

wherein:
R* and R2 each represent a vinyl-group containing unsaturated radical; and
R1 represents a substituted or unsubstituted C1-C20 saturated or unsaturated organic radical.

According to one embodiment of the invention, the above-mentioned vinyl-group containing unsaturated radical is selected from the group consisting of:

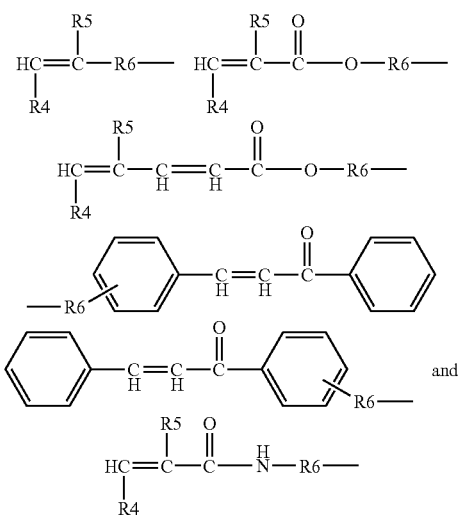

wherein:
R4 and R5 each represent H or a substituted or unsubstituted C1-C5 alkyl group, and R6 represents a covalent bond or a substituted or unsubstituted C1-C20 organic radical.

Moreover, the above-mentioned R1 group is selected from the group consisting of:

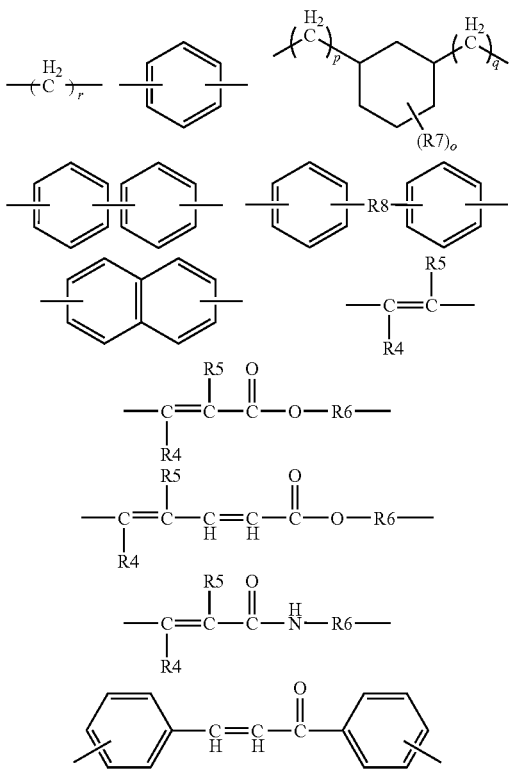

wherein:
o, p, q, and r each represent an integer of 0 or more;
R4, R5, and R6 are as defined hereinbefore;
R7 represents H or a substituted or unsubstituted C1-C12 organic radical; and
R8 represents a covalent bond or an organic radical selected from the group consisting of:

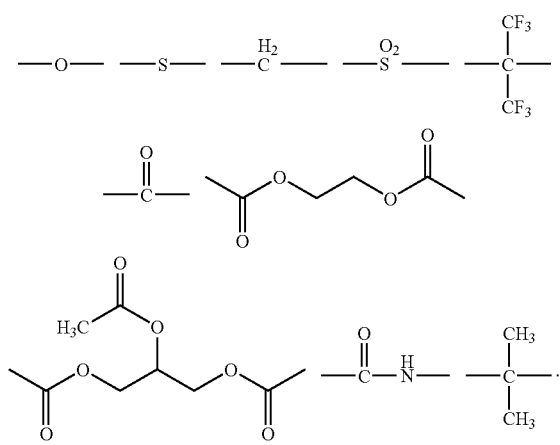

The present invention further provides a photosensitive composition comprising at least 1% of the photosensitive polyimide of formula (I), a photoinitiator, and a solvent. The photosensitive composition of the invention can be used as a liquid photo resist or dry film resist, or used in a solder resist, coverlay film, or printed wiring board. The weight percentages of the components of the photosensitive composition can be adjusted to fulfill the demands of the desired product. Normally, the photosensitive polyimide of formula (I) is present in an amount of 1% by weight, preferably 10% to 50% by weight, based on the total weight of the photosensitive composition, and the photoinitiator is present in an amount of at least 0.001% by weight, preferably 0.01% to 1% by weight, based on the total weight of the photosensitive composition.

According to the present invention, the photoinitiators suitable for the above-mentioned composition are not particularly limited and can be selected from the group consisting of: benzophenone, benzoin, 2-hydroxy-2-methyl-1-phenyl-propan-1-one, 2,2-dimethoxy-1,2-diphenylethan-1-one, 1-hydroxy cyclohexyl phenyl ketone, 2,4,6-trimethylbenzoyl diphenyl phosphine oxide, N-phenylglycine, 9-phenylacridine, benzyldimethylketal, 4,4'-bis(diethylamino)diphenyl ketone, 2,4,5-triarylimidazole dimmers and a mixture thereof. Preferably, the photoinitiator is benzophenone.

According to the present invention, the solvent suitable for the above-mentioned composition is not particularly limited and can be selected from the group consisting of N-methylpyrrolidone (NMP), N,N-dimethylacetamide (DMAC), N,N-dimethylformamide (DMF), dimethyl sulfoxide (DMSO), toluene, xylene, and a mixture thereof.

In order to increase the photo-crosslinking degree, the photosensitive composition of the present invention optionally comprises a certain amount of a reactive monomer or short-chain oligomer for making the molecules crosslinked. According to the present invention, suitable reactive monomers or oligomers are not particularly limited and can be selected from the group consisting of: 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxypolyethylene glycol methacrylate, β-methacryloyloxyethylhydrodiene phthalate, β-methacryloyloxyethylhydrodiene succinate, 3-chloro-2-hydroxypropyl methacrylate, stearyl methacrylate, phenoxyethyl acrylate, phenoxydiethylene glycol acrylate, phenoxypolyethylene glycol acrylate, β-acryloyloxyethylhydrodiene succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, polypropylene glycol dimethacrylate, 2-hydroxy-1,3-dimethacryloxypropane, 2,2-bis[4-(methacryloxyethoxy)phenyl]propane, 2,2-bis[4-(methacryloxydiethoxy)phenyl]propane, 2,2-bis[4-(methacryloxypolyethoxy)phenyl]propane, polyethylene glycol diacrylate, tripropylene glycol diacrylate, polypropylene glycol diacrylate, 2,2-bis[4-(acryloxydiethoxy)phenyl]propane, 2,2-bis[4-(acryloxypolyethoxy)phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxypolyethylene glycol acrylate, nonylphenoxypolypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-hexanediol methacrylate, 1,9-nonanediol methacrylate, 2,4-diethyl-1,5-pentanediol dimethacrylate, 1,4-cyclohexanedimethanol dimethacrylate, dipropylene glycol diacrylate, tricyclodecanedimethanol diacrylate, 2,2-hydrogenated bis[4-acryloxypolyethoxy]phenyl) propane, 2,2-bis[4-acryloxypolypropoxy]phenyl)propane, 2,4-diethyl-1,5-pentanediol diacrylate, ethoxylated trimethylolpropane triacrylate, propoxylated trimethylolpropane triacrylate, isocyanuric acid tri(ethaneacrylate), pentaerythritol tetraacrylate, ethoxylated pentaerythritol tetraacrylate, propoxylated pentaerythritol tetraacrylate, ditrimethylolpropane tetraacrylate, dipentaerythritol polyacrylate, triallyl isocyanurate, glycidyl methacrylate, allyl glycidyl ether, 1,3,5-triacryloylhexahydro-s-triazine, triallyl 1,3,5-benzenecarboxylate, triallylamine, triallyl citrate, triallyl phosphate, allobarbital, diallylamine, diallyldimethylsilane, diallyl disulfide, diallyl ether, diallyl cyanurate, diallyl isophthalate, diallyl terephthalate, 1,3-diallyloxy-2-propanol, diallyl sulfide, diallyl maleate, 4,4'-isopropylidenediphenol dimethacrylate, and 4,4'-isopropylidenediphenol diacrylat. The reactive monomer or oligomer, if present, is present in an amount of at least 0.1 wt %, preferably from 0.1 wt % to 20 wt % based on the total weight of the photosensitive composition of the present invention.

The invention will be further described by the following examples, and the description is only used to illustrate the present invention, rather than to limit the scope of the present invention. Any modifications or equivalents that can be easily accomplished by persons skilled in the art are within the scope of the disclosure of the present specification and the appended claims.

In the examples, the abbreviations used are defined as follows:
PMDA: pyromellitic dianhydride
DABA: 3,5-diamino benzoic acid
6FDA: 4,4'-hexafluoroisopropylidene-2,2-bis-(phthalic acid anhydride
BAPA: 2,2'-bis(3-amino-4-hydroxyphenyl)propane
MBAA: bis(4-amino-3-carboxyphenyl)methane
MEMG: bis(4-aminophenoxy)methane
TAB-E: 3,3',4,4'-tetraaminodiphenyl ether
IEM: 2-Isocyanatoethyl methacrylate
MI: 1-methylimidazole
HEMA: 2-hydroxyethyl methacrylate
HMC: 4'-hydroxy-4-methoxychalcone
TMDC: tetramethylene diisocyanate
IPDI: isophorone diisocyanate
PTZ: phenothiazine
DMAC: dimethyl acetamide
NMP: N-methylpyrrolidone

EXAMPLE 1

Synthesis of Carboxy-Group Containing Polyimide (P1)

43.62 g (0.2 mol) PMDA and 30.43 g (0.2 mol) DABA were added to 300 mL NMP. The mixture was stirred at room temperature for 1 hour and then warmed up to 50° C. and stirred for 4 hours. Thereafter, 50 mL xylene was added and the water was removed by dean-stark apparatus at 150° C. After the water was completely removed, a carboxy-group containing polyimide solution (P1) was obtained.

EXAMPLE 2

Synthesis of Polyimide with Carboxy Group Modified by Isocyanate (I-P1)

1.4 g 1-MI, 15.5 g IEM, and 0.1 g PTZ were added to 370 g P1. The mixture was stirred at room temperature for 1 hour. Thereafter, the mixture was warmed up to 60° C. and stirred for 6 hours to obtain the desired polyimide with carboxy group modified by isocyanate (I-P1).

EXAMPLE 3

Synthesis of Hydroxy-Group Containing Polyimide (P2)

88.85 g (0.2 mol) 6FDA and 57.26 g (0.2 mol) BAPA were added to 300 mL NMP. The mixture was stirred at room temperature for 1 hour and then warmed up to 50° C. and stirred for 4 hours. Thereafter, 50 mL xylene was added and the water was removed by dean-stark apparatus at 150° C. After the water was completely removed, an hydroxy-group containing polyimide solution (P2) was obtained.

EXAMPLE 4

Synthesis of Polyimide with Hydroxy Group Modified by Isocyanate (I-P2)

1.67 g 1-MI, 36.86 g IEM, and 0.12 g PTZ were added to 440 g P2. The mixture was stirred at room temperature for 1 hour. Thereafter, the mixture was warmed up to 60° C. and stirred for 6 hours to obtain the desired polyimide with hydroxy group modified by isocyanate (I-P2).

EXAMPLE 5

Synthesis of Polyimide with Carboxy Group Modified by Diisocyanate (DI-P1)

1.4 g 1-MI, 13.01 g HEMA, 14.01 g TMDC, and 0.1 g PTZ were added to 370 g P1. The mixture was stirred at room temperature for 1 hour. Thereafter, the mixture was warmed up to 60° C. and stirred for 6 hours to obtain the desired polyimide with carboxy group modified by diisocyanate (DI-P1).

EXAMPLE 6

Synthesis of Polyimide with Hydroxy Group Modified by Diisocyanate (DI-P2)

1.67 g 1-MI, 13.01 g HEMA, 14.01 g TMDC, and 0.12 g PTZ were added to 440 g P2. The mixture was stirred at room temperature for 1 hour. Thereafter, the mixture was warmed up to 60° C. and stirred for 6 hours to obtain the desired polyimide with hydroxy group modified by diisocyanate (DI-P2).

EXAMPLE 7

Synthesis of Carboxy-Group Containing Polyimide (P3)

43.62 g (0.2 mol) PMDA and 15.22 g (0.1 mol) DABA and 23.03 g (0.1 mol) MEMG were added to 300 mL NMP. The mixture was stirred at room temperature for 1 hour and then warmed up to 50° C. and stirred for 4 hours. Thereafter, 50 mL xylene was added and water was removed by dean-stark apparatus at 150° C. After the water was completely removed, a carboxy-group containing polyimide solution (P3) was obtained.

EXAMPLE 8

Synthesis of Polyimide with Carboxy Group Modified by Isocyanate (I-P3)

0.7 g 1-MI, 7.75 g IEM, and 0.1 g PTZ were added to 420 g P3. The mixture was stirred at room temperature for 1 hour. Thereafter, the mixture was warmed up to 60° C. and stirred for 6 hours to obtain the desired polyimide with carboxy group modified by isocyanate (I-P3).

EXAMPLE 9

Synthesis of Polyimide with Carboxy Group Modified by Diisocyanate (DI-P3)

0.7 g 1-MI, 6.5 g HEMA, 7 g TMDC, and 0.11 g PTZ were added to 420 g P3. The mixture was stirred at room temperature for 1 hour. Thereafter, the mixture was warmed up to 60° C. and stirred for 6 hours to obtain the desired polyimide with carboxy group modified by diisocyanate (DI-P3).

EXAMPLE 10

Synthesis of Hydroxy-Group Containing Polyimide (P4)

88.85 g (0.2 mol) 6FDA and 28.63 g (0. mol) BAPA and 23.03 g (0.1 mol) MEMG were added to 300 mL NMP. The mixture was stirred at room temperature for 1 hour and then warmed up to 50° C. and stirred for 4 hours. Thereafter, 50 mL xylene was added and the water was removed by dean-stark apparatus at 150° C. After the water was completely removed, an hydroxy-group containing polyimide solution (P4) was obtained.

EXAMPLE 11

Synthesis of Polyimide with Hydroxy Group Modified by Diisocyanate (DI-P4)

0.85 g 1-MI, 6.51 g HEMA, 11.12 g IPDI, and 0.11 g PTZ were added to 490 g P4. The mixture was stirred at room temperature for 1 hour. Thereafter, the mixture was warmed up to 60° C. and stirred for 6 hours to obtain the desired polyimide with hydroxy group modified by diisocyanate (DI-P4).

EXAMPLE 12

Synthesis of Polyimide with Hydroxy Group Modified by Diisocyanate (DI-P5)

0.85 g 1-MI, 25.43 g HMC, 22.23 g IPDI, and 0.11 g PTZ were added to 490 g P4. The mixture was stirred at room temperature for 1 hour. Thereafter, the mixture was warmed up to 60° C. and stirred for 6 hours to obtain the desired polyimide with hydroxy group modified by diisocyanate (DI-P5).

EXAMPLE 13

Synthesis of Amino-Group Containing Polyimide (P6)

43.62 g (0.2 mol) PMDA, 23.03 g (0.1 mol) TAB-E, and 28.63 g (0.1 mol) DABA were added to 300 mL NMP. The mixture was stirred at room temperature for 1 hour and then warmed up to 50° C. and stirred for 4 hours. Thereafter, 50 mL xylene was added and water was removed by dean-stark apparatus at 150° C. After the water was completely removed, a amino-group containing polyimide solution (P6) was obtained.

EXAMPLE 14

Synthesis of Polyimide with Amino Group Modified by Isocyanate (I-P6)

0.85 g 1-MI, 15.5 g IEM, and 0.1 g PTZ were added to 440 g P6. The mixture was stirred at room temperature for 1 hour. Thereafter, the mixture was warmed up to 60° C. and stirred for 6 hours to obtain the desired polyimide with amino group modified by isocyanate (I-P6).

EXAMPLE 15

Synthesis of Polyimide with Amino Group Modified by Diisocyanate (DI-P6)

1.45 g 1-MI, 6.51 g HEMA, 11.12 g IPDI, and 0.11 g PTZ were added to 440 g P6. The mixture was stirred at room temperature for 1 hour. Thereafter, the mixture was warmed up to 60° C. and stirred for 6 hours to obtain the desired polyimide with amino group modified by diisocyanate (DI-P6).

What is claimed is:

1. A photosensitive polyimide of the following(I):

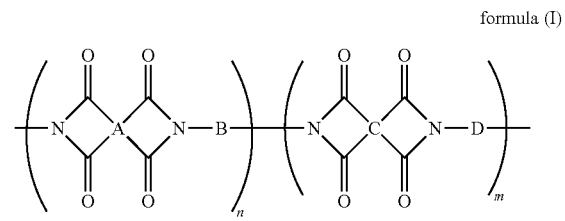

formula (I)

wherein:
A and C can be the same or different and each represent a tetravalent organic group;
B represents a divalent organic group containing at least one of the following radicals;

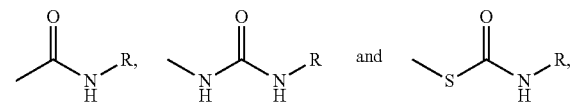

with the proviso that B does not comprise

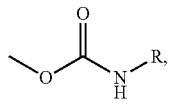

where R represents either a vinyl-group containing unsaturated radical or a radical of the following:

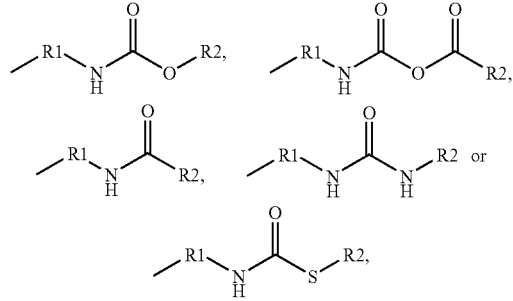

wherein R1 represents a substituted or unsubstituted C1-C20 saturated or unsaturated organic radical, and R2 represents a vinyl-group containing unsaturated radical;

D represents a divalent organic group;

n is an integer of more than 0; and m is an integer of 0 or more.

2. The photosensitive polyimide of claim 1, wherein the vinyl-group containing unsaturated radical is selected from the group consisting of:

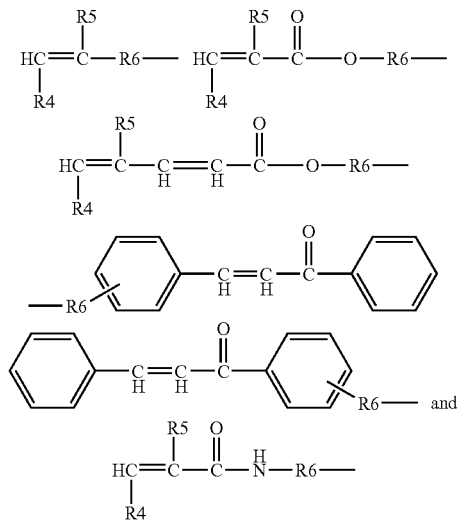

wherein:

R4 and R5 each represent H or a substituted or unsubstituted C1-C5 alkyl group, and R6 represents a covalent bond or a substituted or unsubstituted C1-C20 organic radical.

3. The photosensitive polyimide of claim 1, wherein the vinyl-group containing unsaturated radical is selected from the group consisting of:

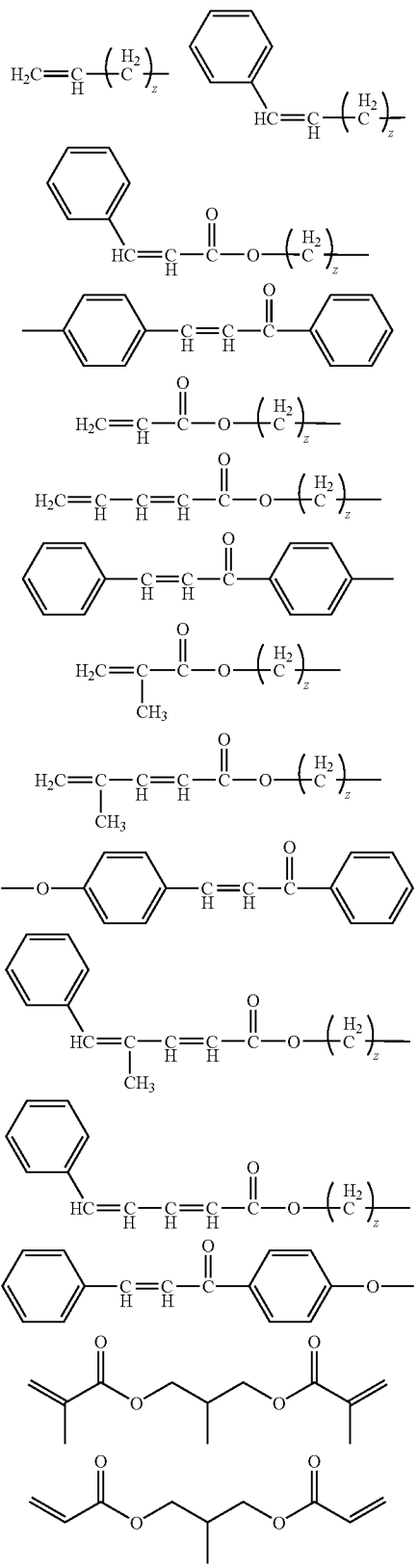

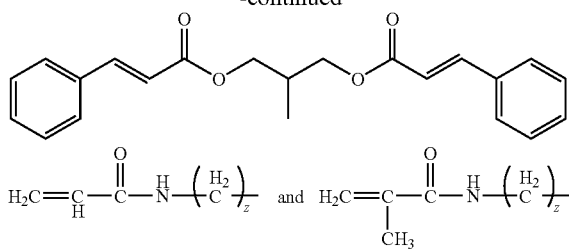

wherein z represents an integer from 0 to 6.

4. The photosensitive polyimide of claim 1, wherein R1 represents a radical selected from the group consisting of:

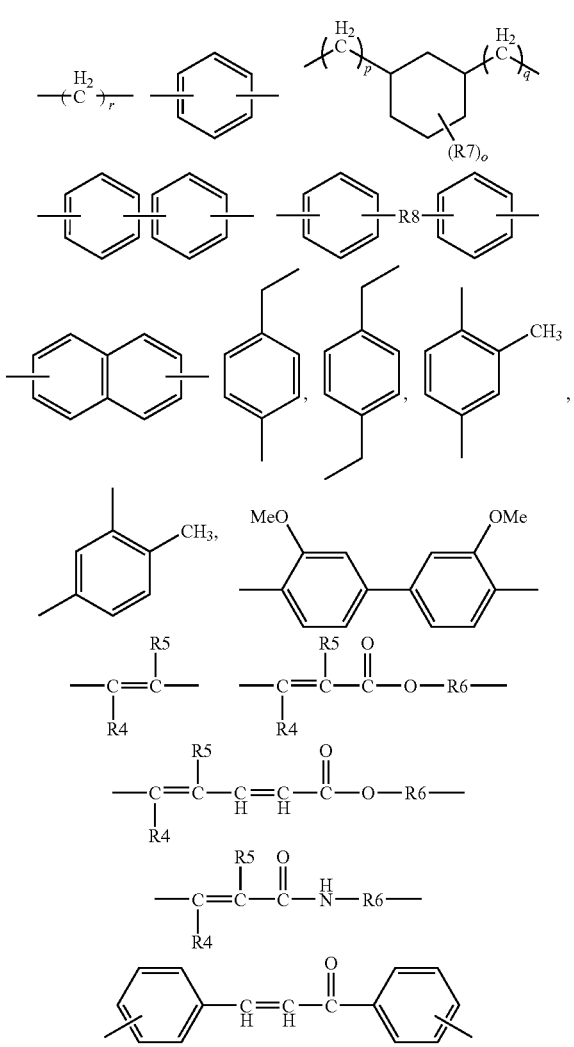

wherein:
o, p, q, and r each represent an integer of 0 or more;
R4 and R5 each represent H or substituted or unsubstituted C1-C5 alkyl group, and
R6 represents a covalent bond or a substituted or unsubstituted C1-C20 organic radical;
R7 represents H or a substituted or unsubstituted C1-C12 organic radical; and R8 represents a covalent bond or organic radical selected from the group consisting of:

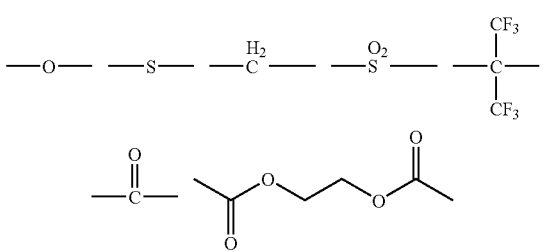

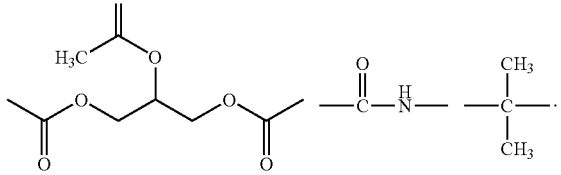

5. The photosensitive polyimide of claim 4, wherein R1 is selected from the group consisting of:

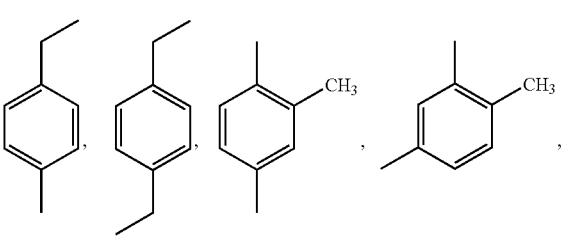

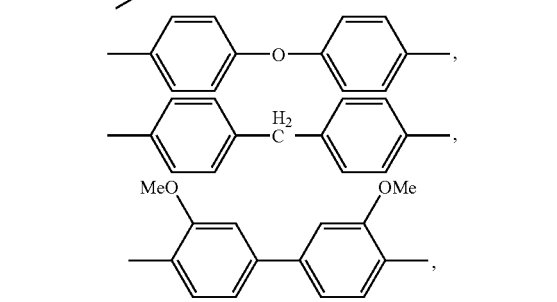

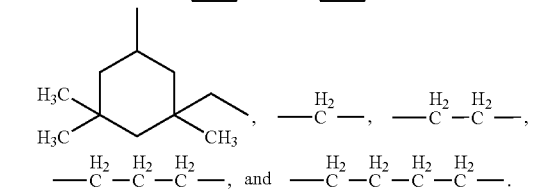

6. The photosensitive polyimide of claim 1, wherein A and C are independently selected from the group consisting of:

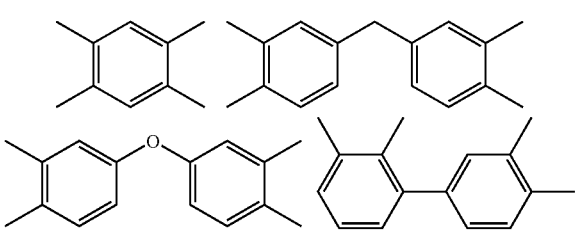

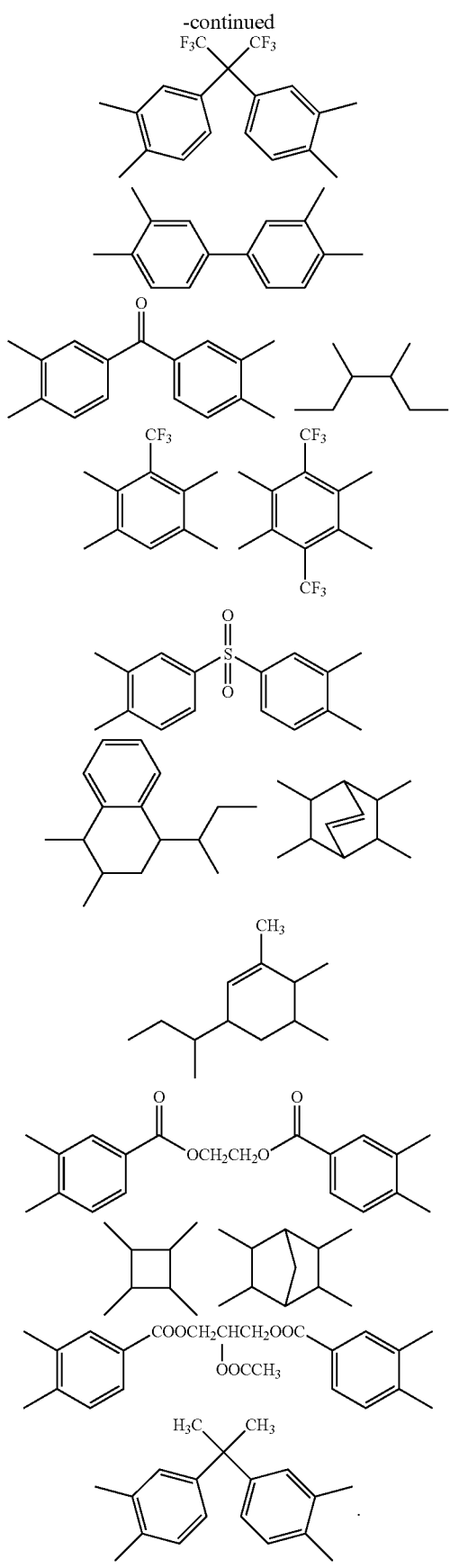

7. The photosensitive polyimide of claim 1, wherein the divalent organic group B is selected from the group consisting of:

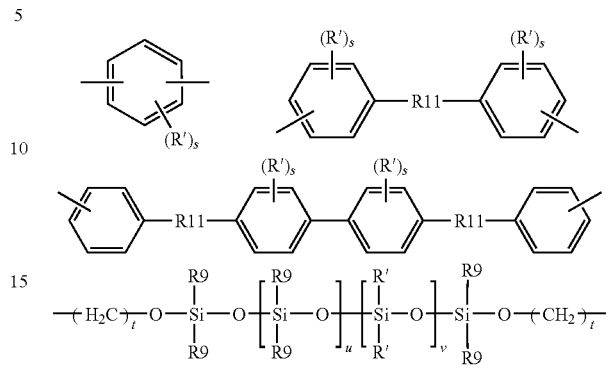

wherein R' is an organic group containing

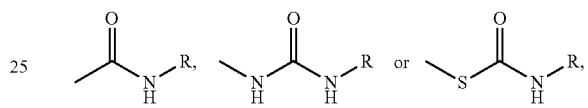

R9 represents H, methyl, or ethyl;
s is an integer of 1 to 4;
t is an integer of 0 to 5;
u is an integer of 0 or more;
v is an integer of more than 0; and
R11 represents a covalent bond or a radical selected from the group consisting of:

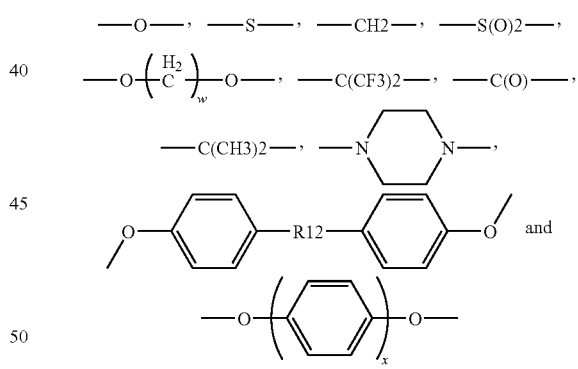

wherein w and x each represent an integer of more than 0, and R12 represents a covalent bond or a substituted or unsubstituted C1-C18 organic radical, and wherein R is as defined in claim 1.

8. The photosensitive polyimide of claim 7, wherein the divalent organic group B is selected from the group consisting of:

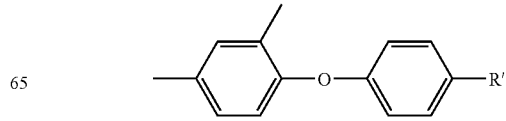

-continued
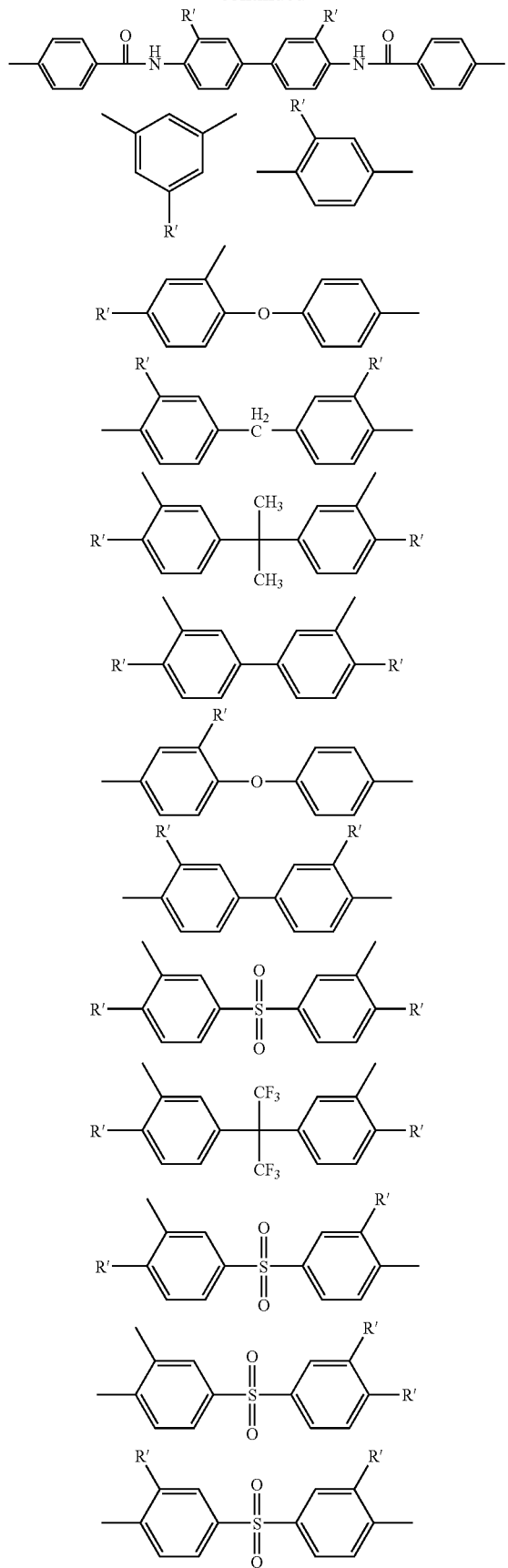
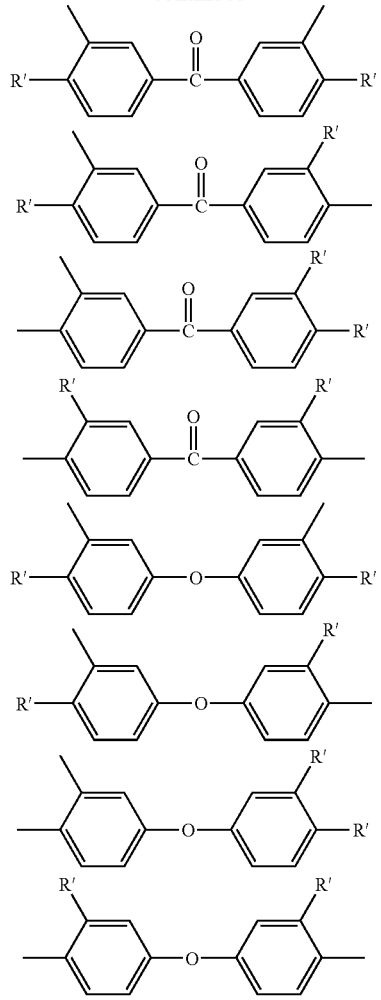
wherein R' is as defined in claim 7.
9. the photosensitive polyimide of claim 1, wherein group D is selected from the group consisting of:
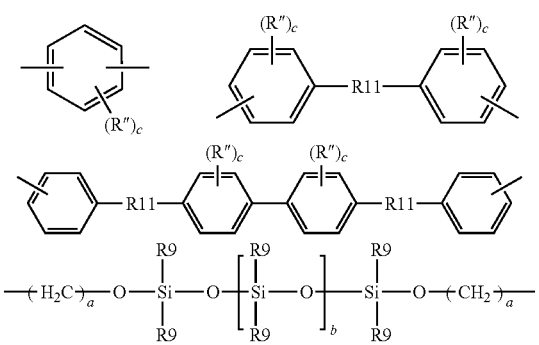
wherein:
R" represents H, C—C4 alkyl, C1-C4 perfluoroalkyl, methoxy, ethoxy, a halogen, OH, COOH, NH2, or SH;
R9 represents H, methyl, or ethyl;
s is an integer of 1 to 4;
t is an integer of 0 to 5;
u is an integer of 0 or more;
v is an integer of more than 0; and R11 represents a covalent bond or a radical selected from the group consisting of:

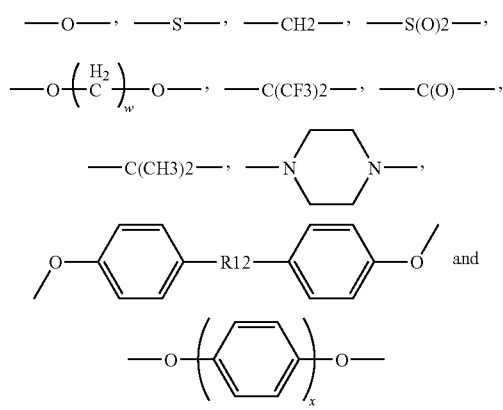

wherein w and x each represent an integer of more than 0, and R12 represents a covalent bond or substituted or unsubstituted C1-C18 organic radical;

c is an integer of 0 to 4;

a is an integer of more than 0, and b is an integer of more than 0.

10. The photosensitive polyimide of claim 9, wherein group D is selected from the group consisting of:

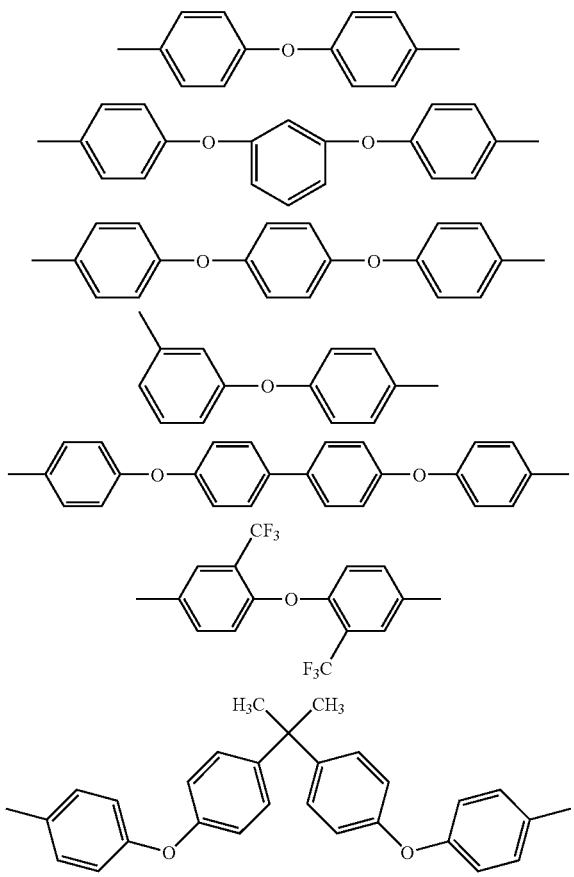

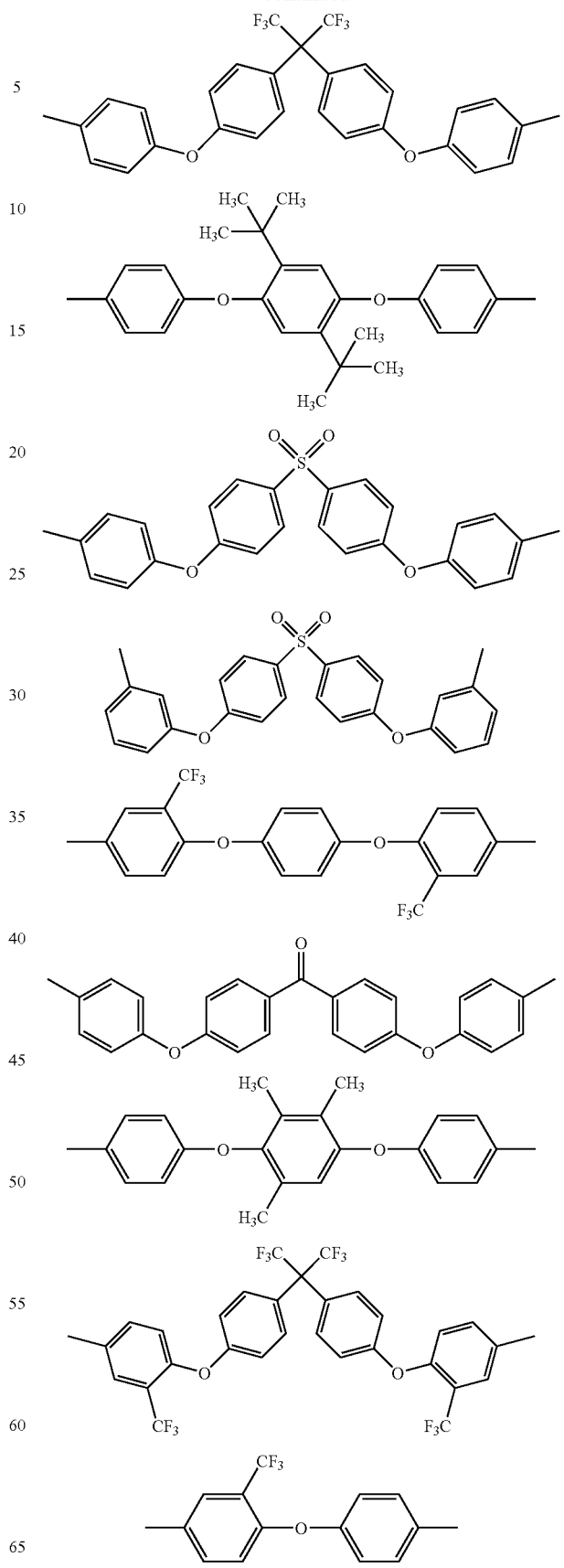

-continued

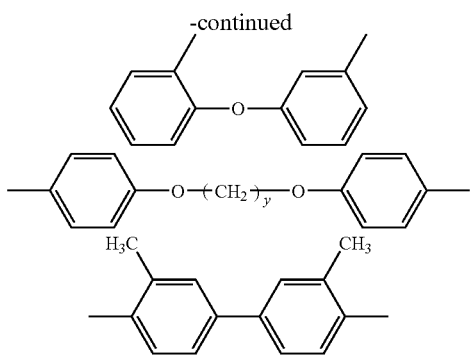

wherein y is an integer of 1 to 12.

11. A photosensitive composition comprising at least 1% by weight, based on the total weight of the composition, of the photosensitive polyimide of claim 1 and at least one photoinitiator.

12. The photosensitive composition of claim 11, further comprising a reactive monomer or oligomer.

13. A liquid photo resist or dry film resist comprising the photosensitive composition of claim 11.

14. A liquid photo resist or dry film resist comprising the photosensitive composition of claim 12.

15. A photosensitive polyimide of the following formula (I):

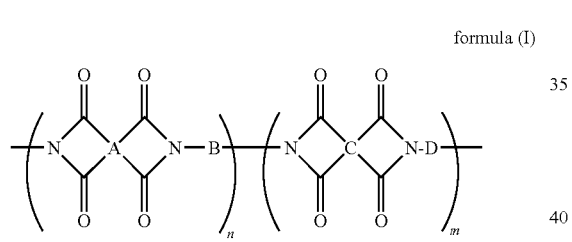

formula (I)

wherein:

A and C can be the same or different and each represent a tetravalent organic group;

B represents a divalent organic group containing the radical;

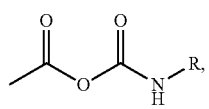

where R represents a radical of the following:

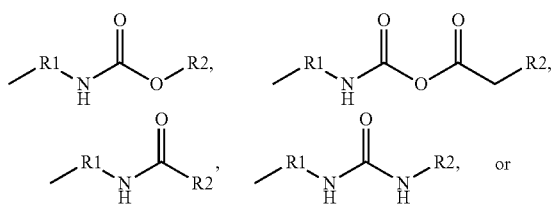

-continued

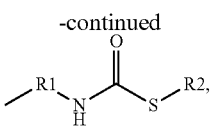

wherein R1 represents a substituted or unsubstituted C1-C20 saturated or unsaturated organic radical, and R2 represents a vinyl-group containing unsaturated radical;

D represents a divalent organic group;

n is integer of more than 0; and m is an integer of 0 or more.

16. A photosensitive polyimide of the following formula (I):

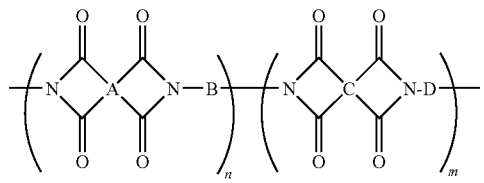

formula (I)

wherein:

A and C can be the same or different and each represent a tetravalent organic group;

B represents a divalent organic group containing the following radical:

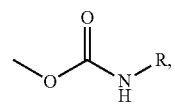

where R represents a radical of the following:

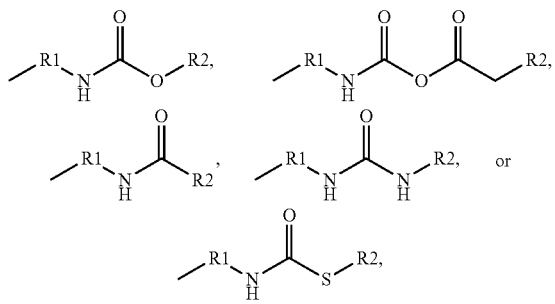

wherein R1 represents a substituted or unsubstituted C1-C20 saturated or unsaturated organic radical, and R2 represents a vinyl-group containing unsaturated radical;

D represents a divalent organic group;

n is an integer of more than 0; and m is an integer of 0 or more.

17. The photosensitive polyimide of claim 1, wherein B represents a divalent organic group containing at least one of the following radicals:
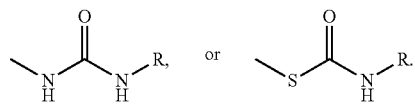
18. The photosensitive polyimide of claim 1, wherein R represents a radical selected from the group consisting of:
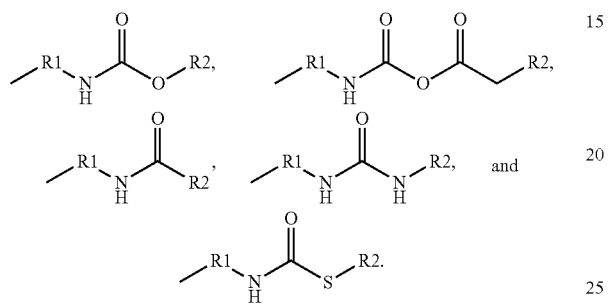
* * * * *